US00RE35873E

United States Patent [19]

Simmons et al.

[11] E Patent Number: Re. 35,873

[45] Reissued Date of Patent: Aug. 18, 1998

[54] SHIELDED PRINTED CIRCUIT CARD HOLDER

[75] Inventors: Randy Gray Simmons, Lewisville; Riley Keith Barker, Lexington; Ronald Dillon Sizemore, Germanton, all of N.C.

[73] Assignee: The Whitaker Corporation, Wilmington, Del.

[21] Appl. No.: 698,501

[22] Filed: Aug. 15, 1996

Related U.S. Patent Documents

Reissue of:

[64] Patent No.: 5,339,222
Issued: Aug. 16, 1994
Appl. No.: 43,316
Filed: Apr. 6, 1993

[51] Int. Cl.[6] ..... H05K 9/00

[52] U.S. Cl. ..... 361/818; 361/737; 174/35 R; 174/51

[58] Field of Search ..... 361/818, 728–730, 361/736–737, 752, 760, 777; 174/35 R, 35 MS, 51; 235/380, 492, 441

[56] References Cited

U.S. PATENT DOCUMENTS

| | | | |
|---|---|---|---|
| Re. 33,513 | 1/1991 | Rosenfeldt et al. | 455/602 |
| 3,579,817 | 5/1971 | Boyle et al. | 29/588 |
| 3,598,896 | 8/1971 | Hassler et al. | 174/52 PE |
| 3,901,731 | 8/1975 | Warszawski et al. | 136/86 R |
| 4,164,068 | 8/1979 | Shropshire et al. | 29/623.1 |
| 4,305,897 | 12/1981 | Hazama et al. | 264/23 |
| 4,386,388 | 5/1983 | Beun | 361/399 |
| 4,458,967 | 7/1984 | King et al. . | |
| 4,758,689 | 7/1988 | Nakao et al. | 174/52 S |
| 4,767,348 | 8/1988 | Murakami | 439/140 |
| 4,784,974 | 11/1988 | Butt | 437/221 |
| 4,872,091 | 10/1989 | Maniwa et al. | 361/424 |
| 4,893,001 | 1/1990 | Ohkubo et al. | 235/490 |
| 4,929,195 | 5/1990 | Seidoh | 439/610 |
| 5,005,106 | 4/1991 | Kiku | 361/424 |
| 5,016,086 | 5/1991 | Inoue et al. | 357/74 |
| 5,061,845 | 10/1991 | Pinnavaia | 235/492 |
| 5,107,073 | 4/1992 | Steffen | 174/52.1 |
| 5,153,818 | 10/1992 | Mukougawa et al. | 361/395 |

(List continued on next page.)

FOREIGN PATENT DOCUMENTS

| | | | |
|---|---|---|---|
| 0 040 753 | 12/1981 | European Pat. Off. | H05K 5/00 |
| 0 459 044 A1 | 12/1991 | European Pat. Off. | H05K 9/00 |
| 0 472 199 A1 | 2/1992 | European Pat. Off. | H01L 21/56 |
| 63-139762 | 9/1988 | Japan | H01M 2/08 |
| 1-186391 | 8/1989 | Japan . | |
| 2-164599 | 7/1990 | Japan . | |
| 4-116899 | 9/1990 | Japan | H05K 9/00 |

OTHER PUBLICATIONS

Three photographs of a prior art Memory Card Frame Kit sold by AMP Incorporated, Part No. 557713 (No date provided).

PCMCIA Standard, Card Physical May 5, 1992.

*Primary Examiner*—Bot L. Ledynh
*Attorney, Agent, or Firm*—Eric Groen; Robert Kapalka

[57] ABSTRACT

This invention is directed to a fully shielded printed circuit (PC) card holder, that may be readily "snapped" into the assembly, or disassembled, as the case may be. The holder is intended to receive a PC card, where at least one end of the card is adapted to be electrically connected to an I/O type connector. The holder comprises a generally rectangular bottom cover member formed of a conductive material, corner supports integrally molded to the bottom cover member at the respective corners thereof, where each support includes a lower flange portion to which the bottom cover member is exposed. Further, a generally rectangular upper cover member is provided where the periphery thereof includes a downwardly extending flange adapted to engage the lower flange portion in electrical contact with the bottom cover member over a substantial portion of the periphery thereof. In the assembled condition, the holder provides continuous shielding against distortion of data signals between the PC card and the I/O type connector.

32 Claims, 6 Drawing Sheets

U.S. PATENT DOCUMENTS 5,206,796 4/1993 Thompson et al. ..... 361/424
5,208,732 5/1993 Boudouin et al. ..... 361/386
5,242,310 9/1993 Leung ..... 439/76
5,330,360 7/1994 Marsh et al. ..... 439/76
5,333,100 7/1994 Anhalt et al. ..... 361/818
5,398,154 3/1995 Perkins et al. ..... 361/212
5,529,503 6/1996 Kerklaan ..... 439/76.1

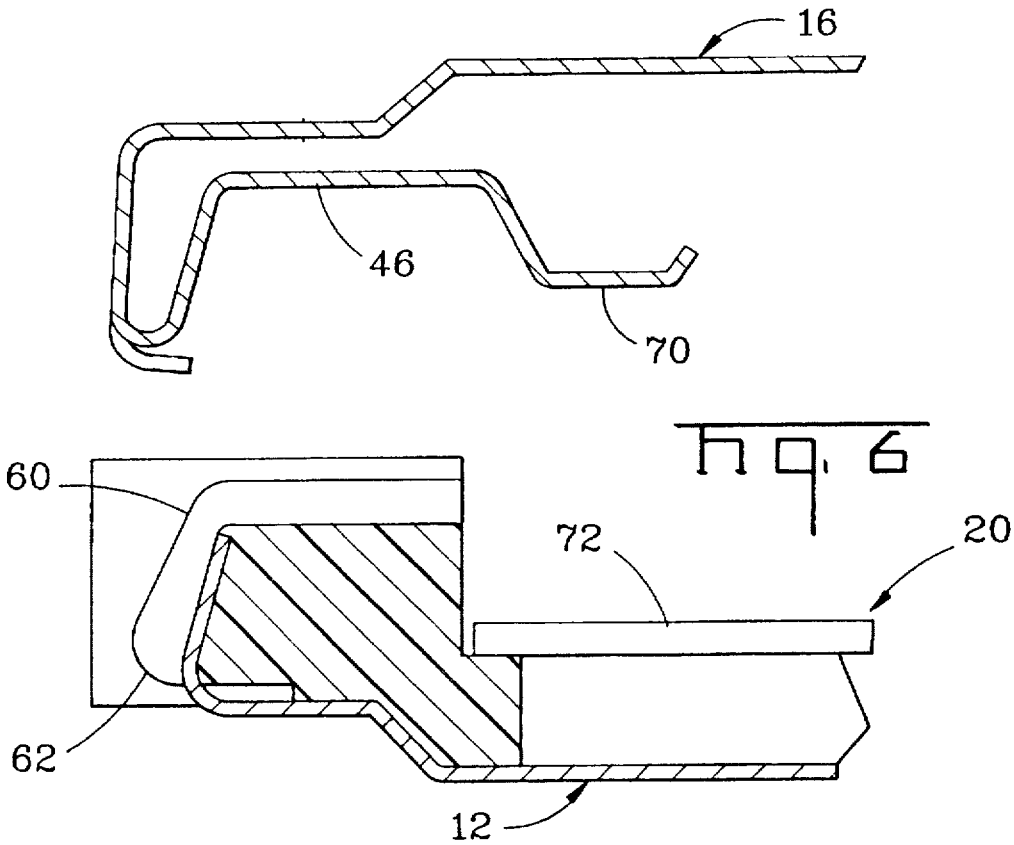
Fig. 6
Fig. 7
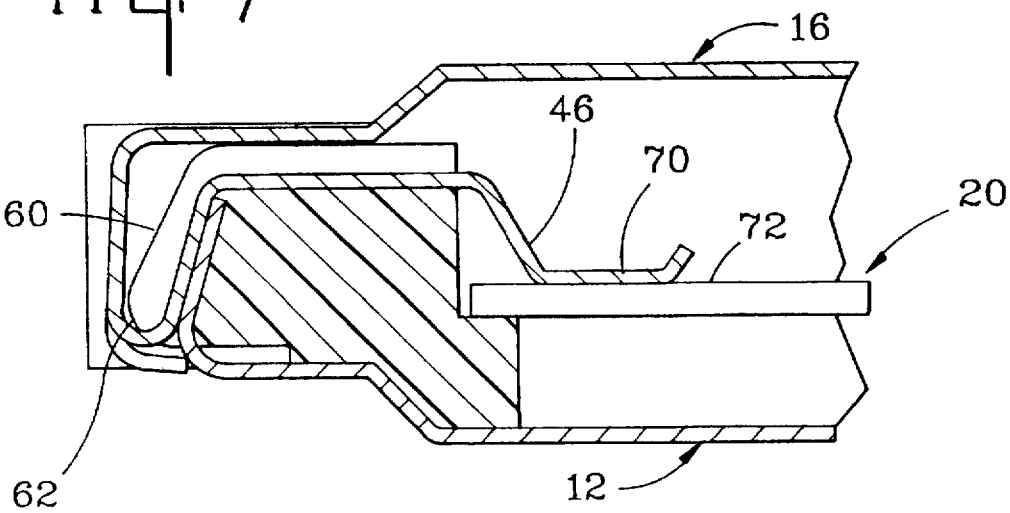

SHIELDED PRINTED CIRCUIT CARD HOLDER

Matter enclosed in heavy brackets [ ] appears in the original patent but forms no part of this reissue specification; matter printed in italics indicates the additions made by reissue.

RELATED APPLICATION

This invention represents an improvement to the memory card shielding apparatus disclosed and claimed in U.S. Ser. No. 07/996,560, filed Dec. 24, 1992, assigned to the assignee hereof.

BACKGROUND OF THE INVENTION

With the advent of sophisticated computers, facsimile machines, printers, and other computer-related electronics equipment, the need for external printed circuit (PC) interface to be used by the computer and computer-related equipment is ever increasing. To this end, PC cards containing external memory and data to be used in computer processes have been designed. At the present time, there are three different PC card types, as defined by the Personal Computer Memory Card International Association (PCMCIA). This is the standards body responsible for developing the 68-pin PC card standard. The three PC card types, are as follows:

a. Type I PC Cards are the same width and length as a common credit card, 54 mm×85.6 mm, but are thicker than a credit card. The thickness of a Type I card is 3.3 mm (0.130").

b. Type II PC Cards are used by those companies which are utilizing memory components that are too high to be housed within a Type I card. Type II memory cards are also the same overall length and width as credit cards, but have raised body cross section in the substrate area which gives them an overall thickness of 5 mm (0.195"). The raised substrate areas of these cards are 48 mm in width.

c. Type III PC Cards are the result of a recent movement sponsored by the Small Form Factor Committee (SFF) to enable 1.8" Small Form Factor Disk Drives to be plugged into memory card connectors in small portable computer applications. Type III PC cards are the same length and width as Type I and Type II PC cards. However, Type III cards have a substrate area thickness of 10.5 mm. Also, Type III PC cards require a card guide opening width of 51 mm of the header connector to accommodate the slightly raised substrate area.

PC cards generally comprise a printed circuit board, a casing made of an insulting material for housing the printed circuit board, and at least one connector, typically referred to as an "I/O" connector. The connector is provided on one end of the casing for interfacing the memory card, and particularly the printed circuit board contained in the casing, to the computer equipment to which the card is mated. The connector is designed to extract the contents of the memory stored on the printed circuit board and to bus data to and from an outside environment, which also usually comprises a computer or other electronic equipment. In this fashion, data traverses the interface between the PC card and the outside environment so that the data can be efficiently transferred and used by the computer to which the card is mated for its intended purpose.

PC cards are generally interchangeable and can be used with many different machines and electronic components.

Because the PC cards are interchangeable, they undergo a significant amount of abuse when transported, interfaced and mated to the different computers and electronic equipment which use them. Since a PC card is conventionally made up of a number of layers and/or elements glued or otherwise bonded together, the individual layers tend to become loose and/or separated from one another as the memory card is subject to flexing stress, as typically occurs when the card is inserted into or removed from the electronic or other computer-type equipment. Thus, even after moderate amounts of usage, conventional memory cards have heretofore frequently become structurally loose, and the internal members of the card often become misaligned. This results in failure of the PC card and degrades the performance of the electronic equipment which uses the card. These undesirable results generally induce poor performance of the computer system which uses the memory card.

Another undesirable result which induces poor performance of the computer system results from inadequate shielding of the PC card and the connectors electrically connected thereto. In the prior art, PC cards had separate shields which were provided proximate the various components of the card. This discontinuous shielding provided breaks in the shielding and limited the effectiveness of the memory card, particularly in environments in which many electronic devices were located. Notwithstanding the above, U.S. Pat. No. 5,005,106 teaches a system for providing continuous shielding to a substrate. Specifically, the patent teaches the use of a flexible, conductive envelope into which the substrate may be inserted, then placed within an insulative housing.

The present invention avoids these undesirable results or complexities by the provision of a continuous shielding arrangement that is easy to assemble. The uniqueness of this arrangement will become apparent from the description which follows, particularly when read in conjunction with the accompanying drawings.

SUMMARY OF THE INVENTION

This invention is directed to a shielded PC card holder, particularly for Type I and Type II cards, where such holder offers continuous shielding thereto, by the combination of a bottom cover integrally molded to the card frame and a cover men, her that will snap fit onto said bottom cover/frame. The holder comprises a generally rectangular bottom cover formed of a conductive material, and corner supports integrally molded to the bottom cover at the respective corners thereof, where each said support includes a lower flange portion to which the bottom cover is exposed. Matable therewith is a generally rectangular upper cover whose periphery includes a downwardly extending flange adapted to engage the lower flange portion in electrical contact with the bottom cover over a substantial portion of the periphery thereof, whereby to provide continuous shielding against distortion of data signals between the PC card and an I/O type connector.

BRIEF DESCRIPTION OF DRAWINGS

FIG. 3 is a sectional view taken along line 3—3 of FIG. 2.

FIG. 6 is an enlarged, partial, sectional view taken through the integral grounding clip, forming part of the upper cover member.

DETAILED DESCRIPTION OF PREFERRED EMBODIMENT

Figure 1:
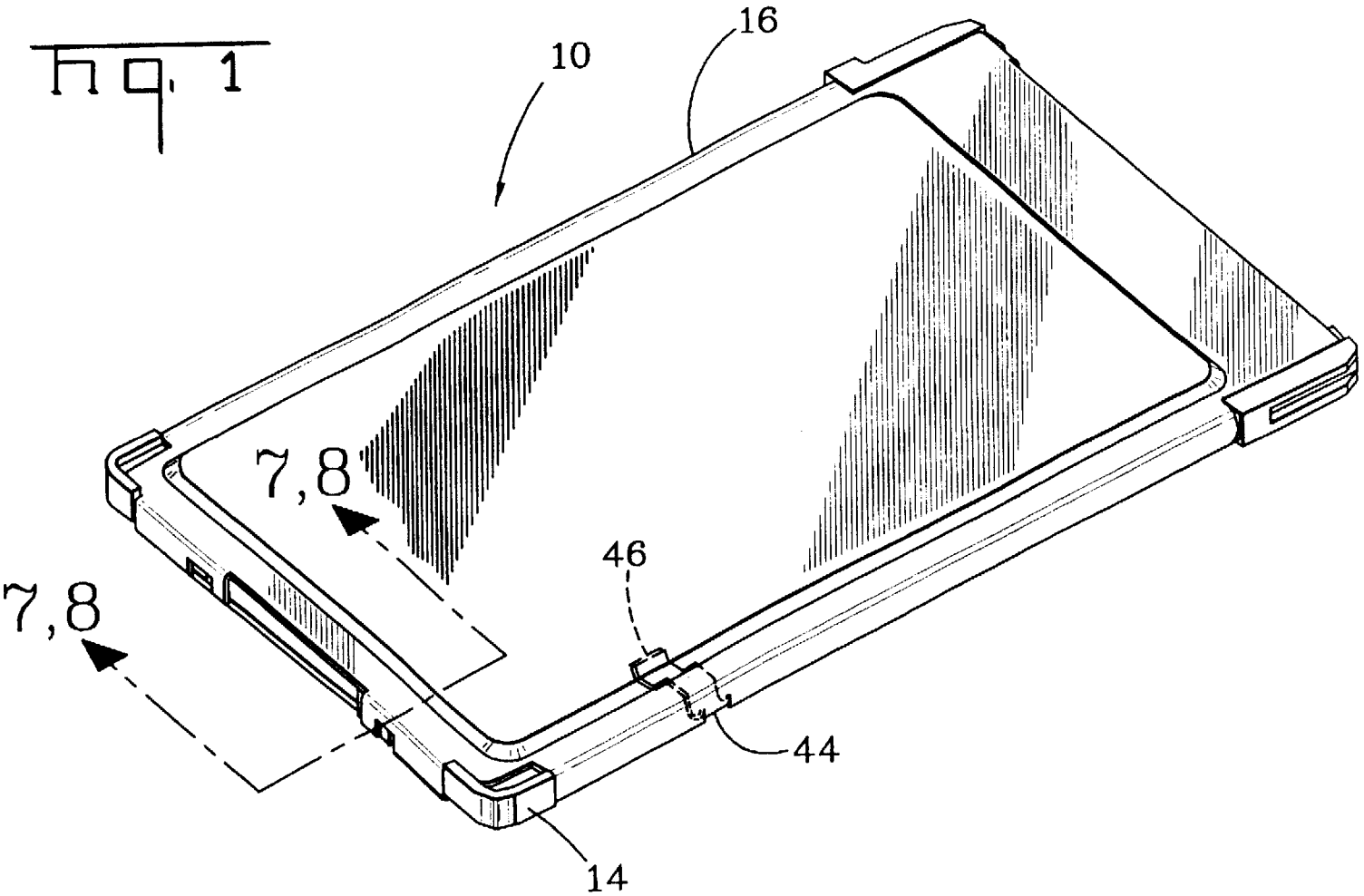
FIG. 1 is a perspective view of an assembled, fully shielded PC card holder according to this invention.
Figure 2:
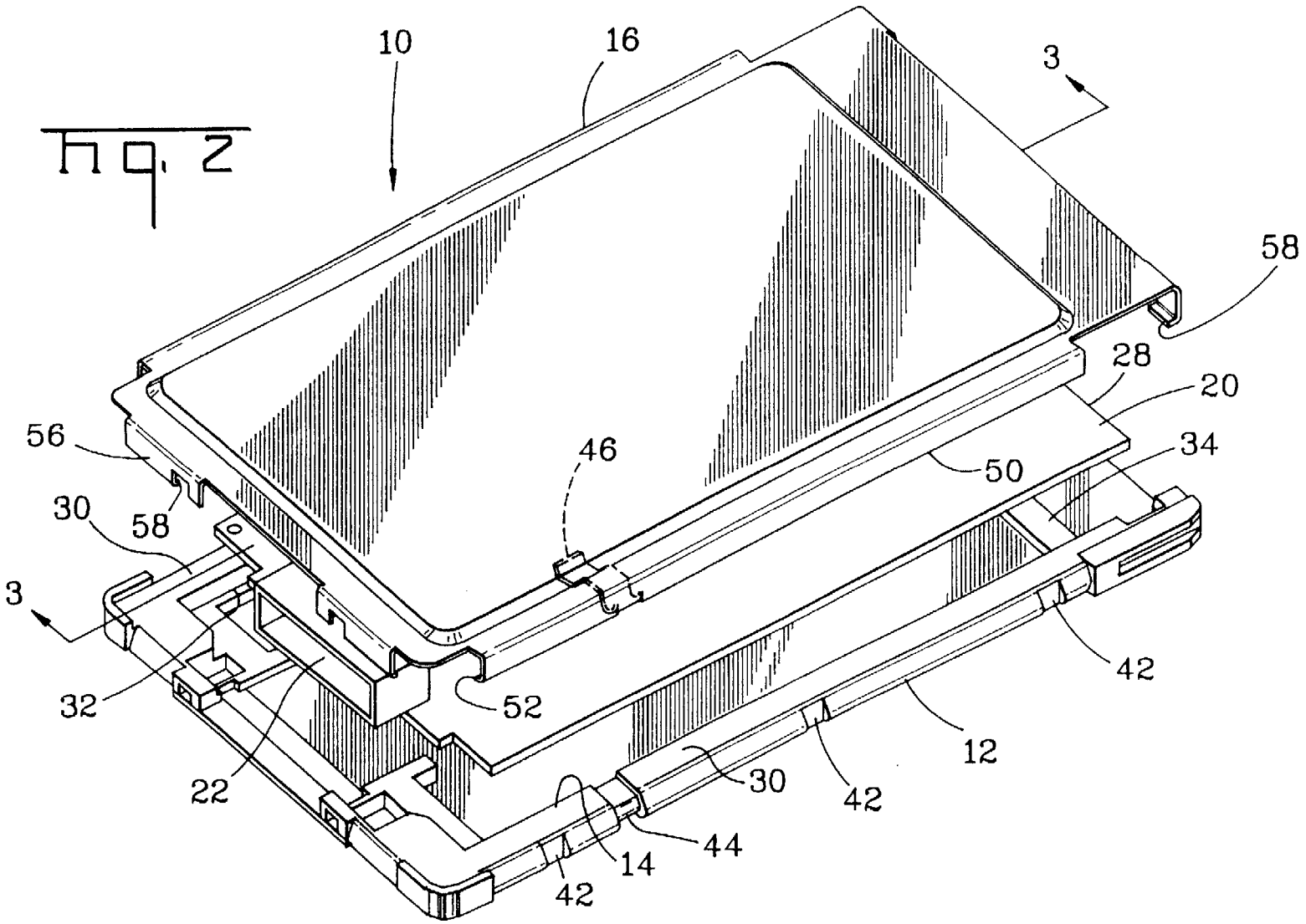
FIG. 2 is an exploded, perspective view, including a PC card for containment therein, of the memory card holder of FIG. 1.

Referring now to the several figures representing the preferred embodiment of this invention, FIGS. 1 and 2 illustrate an assembled and exploded views respectively, of the PC card holder 10 comprising a bottom cover member 12 of a conductive material, such as metal, integrally molded with a dielectric frame 14, and an upper cover member 16, stamped and formed of a conductive material, such as metal, where such cover members 12, 16 are adapted to receive and provide shielding to a PC card 20 therebetween.

A typical PC card may consist of a printed circuit board (PCB), as known in the art, or other type of planar circuit element adapted to store, receive and/or transmit data. Additionally, the PC card 20 may be provided with at least one connector as known in the art, where a receiving cavity therefore is designated by the numeral 22, so that the connector may mechanically and electrically interface with the PC card 20.

The PC card 20 preferably requires a second connector, not shown, such as along the opposite edge 25 28, for mating the PC card to a computer or other device (not shown) which will utilize the card's memory and/or perform computer operations on data which is stored in the PC card and/or received from the outside environment through the connector in cavity 22. In general, the computer or second connector is of a two-piece construction having a posted header for loading onto the host equipment, such as a computer, and a receptacle assembly which is used by the PC card 20, as known in the art.

Returning now to the holder 10, specifically the integrally molded bottom cover 12 and frame 14, the frame thereof includes a pair of side rails 30 having exposed longitudinal surface portions 32 for receiving and supporting the contained PC card 20. Additionally, the frame 14 may include at least one transverse member 34 to provide structural integrity to the frame and support for the PC card.

Figure 4:
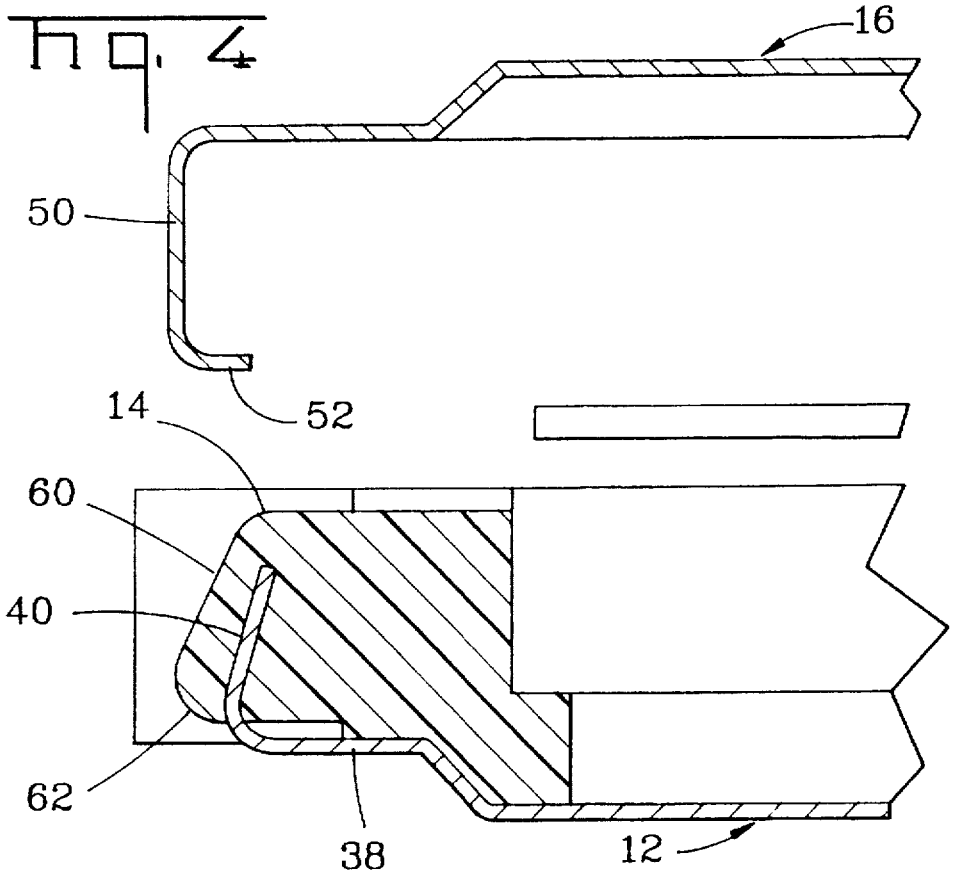
FIG. 4 is an enlarged, partial, sectional view of the PC card holder of FIG. 2, taken of a longitudinal section.
Figure 5:
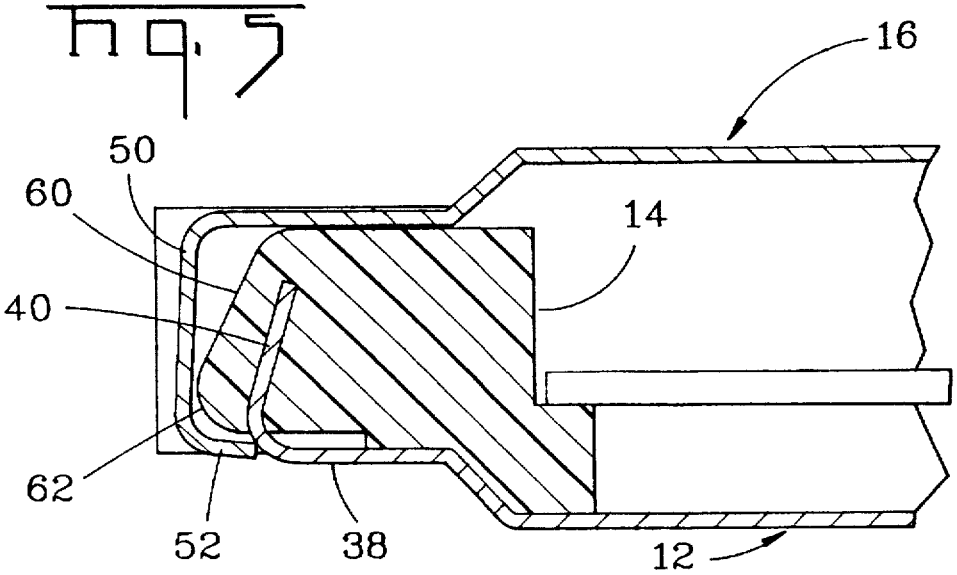
FIG. 5 is an enlarged, partial, sectional view of the PC card holder of FIG. 4, in an assembled and shielded position.

As best seen in the sectional views of FIGS. 3–5, the bottom cover member 12 is essentially a planar member disposed outside the frame 14, except at the edges 36 thereof. The bottom cover member 12 is formed at such edge 36 to yield a peripheral shoulder portion 38 and an upturned edge 40 which is integrally molded into the frame 14, thereby fixing the relative position of the bottom cover member 12 to said frame 14.

Figure 7:
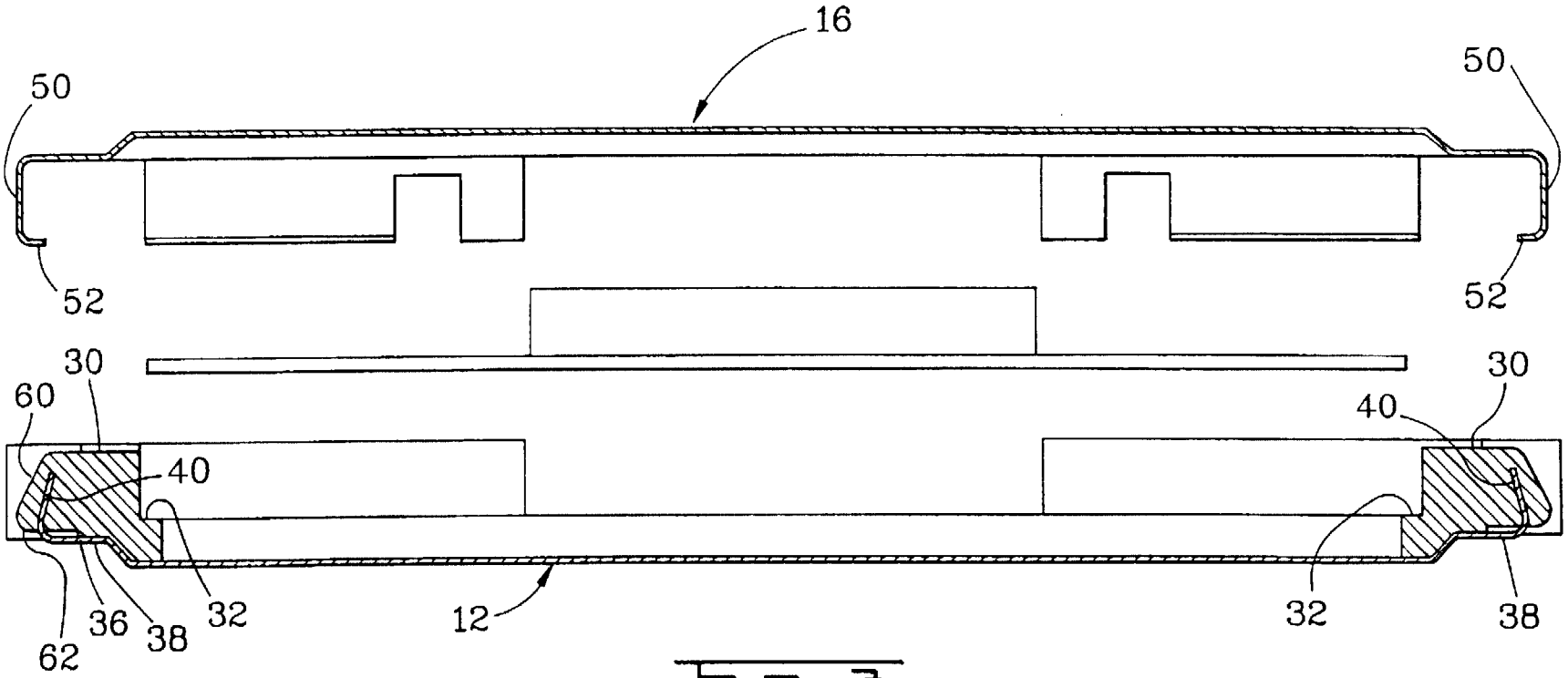
FIG. 7 is an enlarged, partial, sectional view of the PC card holder of FIG. 6, in an assembled and shielded position, taken along line 7—7 of FIG. 1.

Along the side rails 30, plural spaced-apart recesses 42 have been provided. As will be explained hereinafter, in connection with FIGS. 8 and 9, such recesses 42 facilitate the receipt of a suitable tool to allow for the easy removal of the cover member 16 for replacement of the PC card 20. Additionally, a further single recess 44 is included along one of said side rails 30 to accommodate an inturned grounding tab 46, the design and function of which is best illustrated in FIGS. 6 and 7.

Returning now to the upper cover member 16, which is intended to be 'snap' fitted onto the frame 14 in electrical contact with bottom cover 12, the major or longitudinal sides 50 are characterized by essentially continuous inturned flanges 52. The transverse edges 54 are discontinuous to the extent that each may accommodate a connector for engagement with the PC card 20, typically along a midpoint thereof. However, at least at the ends 56 thereof, such ends 56 further include inwardly directed flanges 58 for engagement with the frame 14.

To facilitate the assembly of the PC card holder 10, after placing a PC card 20 therein along surface portions 32, it will be noted that side rails 30 have tapered conforms 60, see FIGS. 4–7, such that as the upper cover flanges 52, 58 contact the tapered surface 60 and the flanges flex outward until they reach the lower most edge 62, then resile into contact 64 with the exposed shoulder portion 38. FIG. 5 best illustrates the latching arrangement of the holder assembly, where it will be seen that the flanges 52, 58 of the upper cover are spaced from the tapered or camming edge 60 and remain in a slightly flexed position so as to insure a constant gripping force and electrical engagement between the respective cover members.

As noted previously, the upper cover member 16, stamped and formed from a sheet metal blank, is provided with a grounding tab 46 or strap aligned with the recess 44. The end 70 of the tab 46 includes a flat portion which is adapted to engage grounding traces, as known in the art on the surface 72 of PC card 20, thereby assuring suitable grounding thereof.

Figure 8:
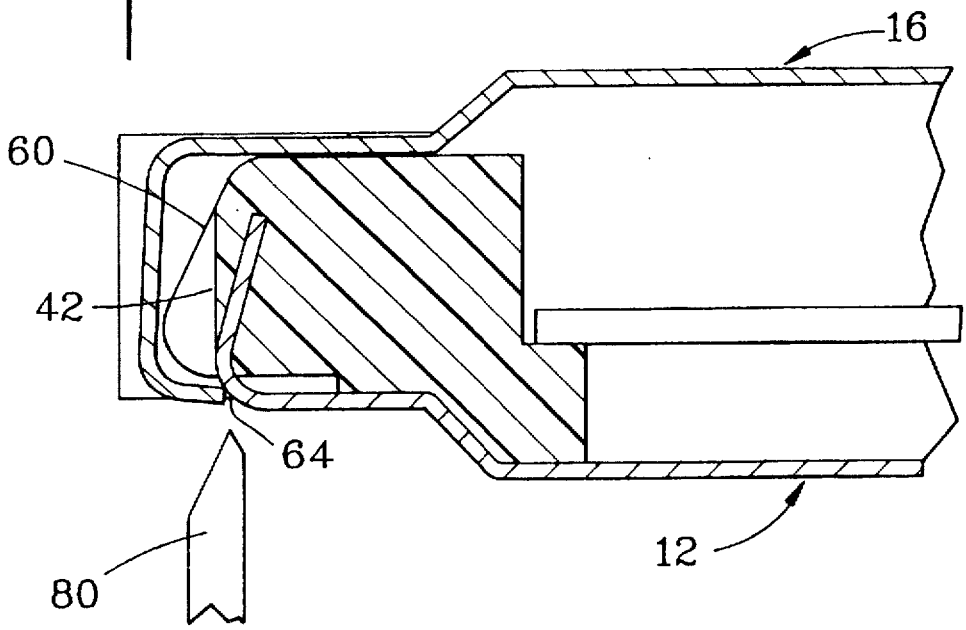
FIG. 8 is an enlarged, partial, sectional view taken along line 8—8 of FIG. 1.
Figure 9:
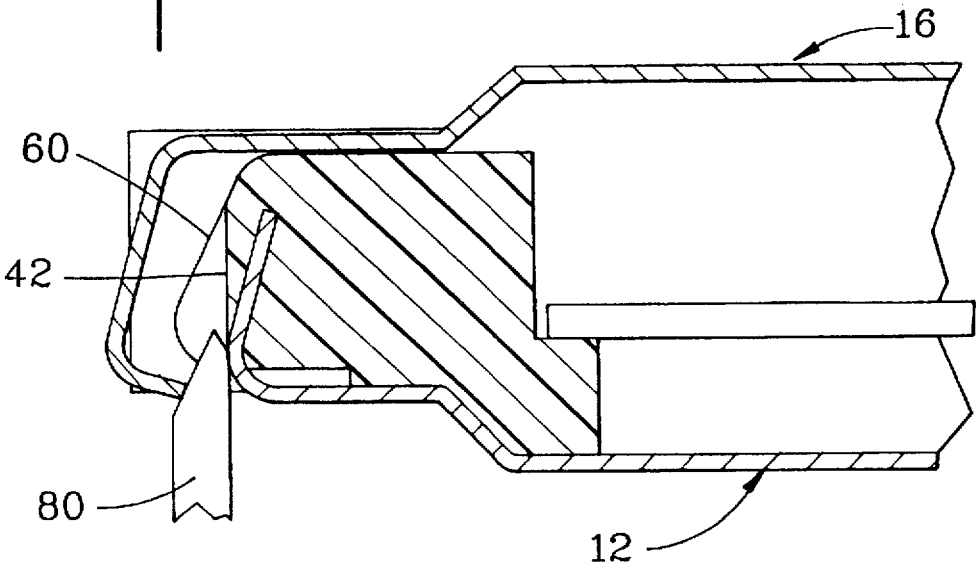
FIG. 9 is a view similar to FIG. 8 illustrating the manner by which the PC card holder of this invention may be disassembled.

FIGS. 8 and 9 demonstrate the manner by which the cover members 12, 16 may be readily separated, as desired. The side rails 30 of the frame 14 have been provided with the plural recesses 42. When disassembly of the holder 10 is required, a suitable bladed tool, where the base 80 is shown in FIGS. 8 and 9, may be inserted at the contact edge 62, between the cover members 12, 16 into the recesses 42. With this action, the flanges 52, 58 are flexed outwardly and freed of the outermost edge 62 for easy removal. A preferred tool for such assembly, though not illustrated in the several figures, can be a planar member, coextensive in dimension to the bottom cover member 16, having plural blade like lances projecting therefrom so that such action is uniformly applied about the periphery of the holder. Thus, by this construction, the holder 10 may be readily assembled, or disassembled, while providing effective shielding during the use thereof.

We claim:

1. A shielded printed circuit (PC) card holder for receiving a PC card, where at least one end of said card is adapted to be electrically connected to an I/O type connector, said holder comprising a rectangular bottom cover member formed of a conductive material, corner supports integrally molded to said bottom cover member at the respective corners thereof, where each said support includes a lower flange portion to which said bottom cover member is exposed, and a rectangular upper cover member whose periphery includes a downwardly extending flange adapted to engage said lower flange portion in electrical contact with said bottom cover member over a major portion of the periphery thereof, whereby to provide continuous shielding against distortion of data signals between the PC card and said I/O type connector.

2. The shielded PC card holder according to claim 1, wherein said molded bottom cover member and said frame includes at least one transverse support member against which said PC card lies.

3. The shielded PC card holder according to claim 1, wherein adjacent said corner supports are joined by rails, and said rail include a tapered edge to facilitate the assembly of said holder.

4. The shielded PC card holder according to claim 3, wherein said rails include a plurality of recesses for receiving a disassembly tool.

5. The shielded PC card holder according to claim 1, including a grounding tab internal with said upper cover member for electrically engaging corresponding grounding traces on said PC card.

6. The shielded PC card holder according to claim 1, wherein said downwardly extending flange is in a flexed state when the holder is assembled, whereby to provide a constant contact force between said bottom and upper cover members.

*7. A shielded printed circuit (PC) card holder for receiving a PC card, where at least one end of said card is adapted to be electrically connected to an I/O type connector, said holder comprising an integrated lower cover and frame member, said lower cover comprising a metallic plate member having upturned portions adjacent to side edges thereof, said frame member comprising a pair of side rails molded on said lower cover member and encapsulating said upturned portions therein to secure said frame member to said lower cover, said card holder further comprising an upper cover securable to said integrated lower cover and frame member, for enclosing a PC card therein.*

*8. The card holder of claim 7, wherein the upper cover comprises a metallic plate member shield.*

*9. The card holder of claim 8, further comprising a PC card positioned therein which is grounded to one of said upper or lower covers.*

*10. The card holder of claim 7, wherein the lower cover member comprises a peripheral shoulder portion.*

*11. The card holder of claim 10, wherein said peripheral shoulder portion is raised relative to a plane defined by the metallic plate member of said lower cover member.*

*12. The card hold holder of claim 11, wherein the upturned portions extend over the peripheral shoulder portions to facilitate molding of the upturned portions in the frame members.*

*13. The card holder of claim 12, wherein the upturned portions are formed at the free edges of the lower cover, and are reversely bent inwards.*

*14. The card holder of claim 10, 11, 12 or 13, wherein the side rails are molded over at least a portion of said shoulder portion, and the frame member conforms to said shoulder portion.*

*15. The card holder of claim 7, wherein the upturned portions are formed at the free edges of the lower cover, and are reversely bent inwards.*

*16. The card holder of claim 7, wherein said side rails further define a support surface for the printed circuit card.*

*17. The card holder of claim 7, wherein said frame member comprises at least one transverse member integrally molded with said side rails and spanning between said side rails.*

*18. The card holder of claim 7, wherein said side rails form an upper surface for contacting said upper cover.*

*19. The card holder of claim 7, wherein said upper cover is fixed to said integrated lower cover and frame member.*

*20. The card holder of claim 19, wherein said upper cover is removably fixed to said integrated lower cover and frame member.*

*21. A printed circuit (PC) card holder, comprising a lower cover comprising a metal shell having upturned sections extending from said metal shell adjacent an outer periphery thereof, and an insulative frame member molded on said metal shell, said frame member encapsulating said upturned sections therein to secure said frame member to said metal shell; a printed circuit card within said lower cover; and an upper cover secured to said lower cover and enclosing said printed circuit card.*

*22. The printed circuit (PC) card holder of claim 21, wherein the metal shell comprises a metal plate.*

*23. The printed circuit (PC) card holder of claim 22, wherein the upper cover and lower cover are in grounding contact along a substantial portion of their respective outer peripheries.*

*24. The printed circuit (PC) card holder of claim 21, wherein the upturned sections extend from outer edges of said metal shell.*

*25. The printed circuit (PC) card holder of claim 21, wherein the upturned sections are turned inwardly so as to grip the frame member.*

*26. A printed circuit (PC) card holder, comprising a frame member and a lower cover comprising a metal shell having at least one fixing section integrally molded in said frame member to secure said frame member to said metal shell; a printed circuit card peripherally within said lower cover; and an upper cover secured to said integrally molded frame and lower cover and enclosing said printed circuit card.*

*27. The printed circuit (PC) card holder of claim 26, wherein the metal shell comprises a metal plate.*

*28. The printed circuit (PC) card holder of claim 27, wherein the upper cover and lower cover are in grounding contact along a substantial portion of their respective outer peripheries.*

*29. The printed circuit (PC) card holder of claim 26, wherein the at least one fixing section extends upwardly from an outer edge of said metal shell.*

*30. The printed circuit (PC) card holder of claim 26, wherein the at least one fixing section is turned inwardly so as to grip the frame member.*

*31. The printed circuit (PC) card holder of claim 26, wherein the frame member is molded of insulative material.*

*32. The printed circuit (PC) card holder of claim 26, further comprising a connector mounted on said printed circuit card to provide an I/O interface.*

* * * * *